United States Patent
Hariz et al.

(10) Patent No.: US 11,038,369 B2
(45) Date of Patent: *Jun. 15, 2021

(54) AUTOMATED TESTING OF EMERGENCY LIGHTS

(71) Applicant: Hexmodal Technologies LLC, Barrington, RI (US)

(72) Inventors: Christopher Hariz, Granada Hills, CA (US); Utkarsh Shah, Barrington, RI (US)

(73) Assignee: HEXMODAL TECHNOLOGIES LLC, Barrington, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/751,119

(22) Filed: Jan. 23, 2020

(65) Prior Publication Data

US 2020/0161893 A1  May 21, 2020

Related U.S. Application Data

(63) Continuation of application No. 16/385,838, filed on Apr. 16, 2019, now Pat. No. 10,581,267.

(60) Provisional application No. 62/661,838, filed on Apr. 24, 2018.

(51) Int. Cl.
*H02J 9/02* (2006.01)
*G08B 29/12* (2006.01)
*G01R 19/155* (2006.01)
*H05B 47/19* (2020.01)
*H05B 47/23* (2020.01)
*H05B 47/21* (2020.01)

(52) U.S. Cl.
CPC .............. *H02J 9/02* (2013.01); *G01R 19/155* (2013.01); *G08B 29/12* (2013.01); *H05B 47/19* (2020.01); *H05B 47/22* (2020.01); *H05B 47/235* (2020.01)

(58) Field of Classification Search
None
See application file for complete search history.

(56) References Cited

U.S. PATENT DOCUMENTS

2013/0127362 A1* 5/2013 Trainor .................. G01R 31/44
                                                            315/224
2018/0042083 A1   2/2018 Couch

* cited by examiner

*Primary Examiner* — Jany Richardson
(74) *Attorney, Agent, or Firm* — Polsinelli (57) ABSTRACT

The subject disclosure relates to power failure simulations, for example to test lighting systems, such as emergency lighting units or lighted signage. In some aspects, a method of the disclosed technology includes steps for receiving an interrupt command, terminating power delivery from a first power supply to a lighting array in response to the interrupt command, and measuring one or more power characteristics of the second power supply. Methods and machine-readable media are also provided.

14 Claims, 6 Drawing Sheets

Hexmodal Automated Testing

Emergency Light Failure Alert

The following issues were discovered while testing in July 2018:

| Device ID# | Test Date | Test Type | Test Result | Issue Details | Learn More |
|---|---|---|---|---|---|
| 1183 | 1/30/2018 | Short | Fail | Lamp #2 did not illuminate during test | More Info |
| 1211 | 1/29/2018 | Long | Fail | Lamps did not maintain illumination for duration of test | More Info |
| 2379 | 1/30/2018 | Short | Fail | Lamps did not illuminate during test | More Info |
| TOTAL FAILURES | | | | | 3 |

Full Test Results Available Online

See All Results

AUTOMATED TESTING OF EMERGENCY LIGHTS

CROSS-REFERENCE TO RELATED APPLICATIONS

This application claims the benefit of U.S. application Ser. No. 16/385,838, filed Apr. 16, 2019, entitled "AUTOMATED TESTING OF EMERGENCY LIGHTS", which claims the benefit of U.S. Application No. 62/661,838, filed Apr. 24, 2018, entitled AUTOMATED TESTING OF EMERGENCY LIGHTS VIA RETROFIT DEVICE", both of which are incorporated by reference in their entirety.

BACKGROUND

1. Technical Field

The subject technology relates to systems and methods for facilitating the management of lighting systems and in particular, for remotely managing emergency lighting systems by simulating power failure events.

2. Introduction

Some conventional emergency lighting systems are connected to a secondary power source, such as a battery, that is activated upon failure of a primary power source, for example, during a power interruption event or blackout. However, testing of such lighting systems requires that a human operator manually simulate power interruption from the primary source, and verify a lighting condition thereafter i.e., to determine if the battery and/or lighting elements will be operation during a blackout. The manual process of testing and verifying emergency lighting systems can be quite onerous, especially in larger facilities, such as hospitals and universities.

BRIEF DESCRIPTION OF THE DRAWINGS

Certain features of the subject technology are set forth in the appended claims. However, the accompanying drawings, which are included to provide further understanding, illustrate disclosed aspects and together with the description serve to explain the principles of the subject technology. In the drawings:

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

Aspects of the disclosed technology address the foregoing limitations of conventional lighting systems by methods and computer-readable media for remotely simulating a power interruption events, and detecting power characteristics of a secondary power supply to verify lighting system operation in the event of a blackout. The disclosed technology also encompasses software and systems to facilitate the management multiple separate lighting devices, e.g., emergency lighting systems that are located at different geographic locations and/or client/tenant sites. As used herein, emergency lighting systems can encompass virtually any type of lighting unit or lighted signage, including but not limited to: emergency light systems, lighted exit signage units, lighted pathway lights, and the like. As discussed in further detail below, management systems can be configured to facilitate tracking of lighting system performance, as well as aid system upkeep, for example, by predicting when backup power sources and/or lighting elements are likely to fail.

SUMMARY OF THE INVENTION

In one aspect, the disclosed technology includes a system for simulating power failure in an emergency lighting system. The system includes an interrupt that is coupled between a first power supply and a lighting array, a power monitoring module coupled between a second power supply and the lighting array, and a wireless transceiver configured for transacting data with a wireless backhaul gateway. The system also includes a microcontroller that is coupled to the power monitoring module, the interrupt relay, and the wireless transceiver. The microcontroller is configured to perform operations for receiving an interrupt command from the wireless backhaul gateway, toggling the interrupt relay in response to the interrupt command in order to interrupt power delivery from the first power supply to the lighting array, and measuring power characteristics of the second power supply to determine if the second power supply can power the lighting array.

In another aspect, the disclosed technology provides a method for simulating a blackout event. The method includes steps for receiving an interrupt command, via a wireless transceiver, from a wireless backhaul gateway, toggling an interrupt relay in response to the interrupt command, and measuring one or more power characteristics of a second power supply, in response to toggling the interrupt relay, to determine if the second power supply can power the lighting array.

In yet another aspect, the disclosed technology provides a non-transitory computer-readable storage medium comprising instructions stored therein, which when executed by one or more processors, cause the processors to perform operations including: receiving an interrupt command from a wireless backhaul gateway, interrupting power delivery from a first power supply to a lighting array, in response to the power delivery interruption, measuring one or more power characteristics of a second power supply to determine if the second power supply can power the lighting array.

Figure 1:
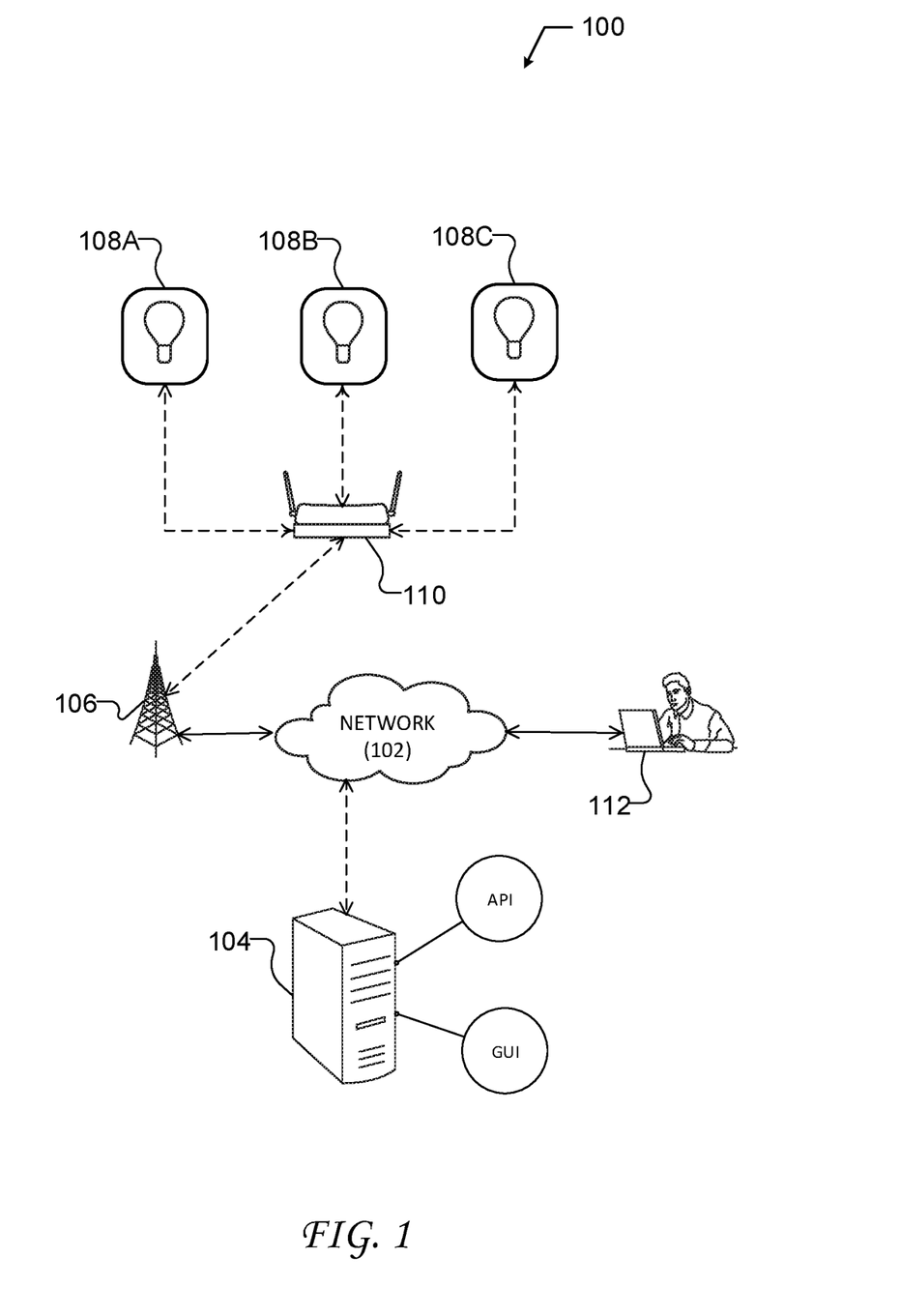
FIG. 1 illustrates an example environment in which an automated remote light testing system can be implemented, according to some aspects of the disclosed technology.

FIG. 1 illustrates an example environment 100 in which one or more emergency lighting systems 108 and a remote testing management system ("management system") can be implemented. Environment 100 includes a variety of emergency lighting devices 108 ("lighting units") that are communicatively coupled to management system 104 via one or more networks, for example, that can include wired or wireless computer networks. In the example provided by environment 100, lighting units (108A, 108B, 108C) are in communication with management system 104 via a backhaul network comprising wireless (backhaul) gateway 110, cellular network 106, and public network 102. The various networks, such as network 102, can also facilitate the communications between one or more user devices, such as user device 112, and management system 104 and/or lighting units 108.

It is understood that various other networks and/or networking devices can be used to facilitate communication between lighting units 108, and management system 104, without departing from the scope of the disclosed technology. Additionally, it is understood that any of the networks used to transport data between lighting units 108, and management system 104 can include a mix of private and/or public networks. For example, network 102, cellular network 106, and/or wireless gateway 110 can be located in separate networks that are part of (or span) one or more public or private network/s, such as a Local Area Network (LAN), a Wide Area Network (WAN), or a network of networks, e.g., the Internet.

Wireless gateway 110, can be configured to transact data between each of lighting units 108, and cellular network 106. Although it is understood that any wireless protocol can be used to transmit data between lighting units 108, and cellular network 106, in some implementations lighting units 108 are configured to communicate using an unlicensed radio frequency band, such as WiFi, i.e., any of the IEEE 802.11 standards, Zigbee, i.e., the IEEE 802.15.4 standard, or LoRaWAN, i.e., the IEEE 802.11ah standard, etc. Additionally, wireless gateway 110 can be configured to communicate with one or more other wireless relay devices, such as in a mesh network configuration. Although any mesh network protocol can be implemented without departing from the scope of the subject disclosure, by way of example, gateway 110 may be configured to communicate over a mesh network using any of the standards listed under the IEEE 802.11s title. It is further understood that various other wireless communication standards can be implemented, without departing from the scope of the disclosed technology. Patent application draft patent application draft for your IOT lighting test specification invention a final draft of the patent application for the Each individual lighting units (108A, 108B, 108C), can include logic and processing capabilities necessary to run tests on one or more lighting elements or arrays, e.g., light emitting diodes (LEDs), and/or light bulbs, etc. For example, lighting units 108 can be configured to simulate power failure events in response to an interrupt command (interrupt signal) received from a remote management system (e.g., management system 104), or that is triggered based on a predetermined testing schedule. Testing can be performed by monitoring power characteristics of one or more backup power sources and/or operability of one or more lighting elements in an associated lighting array. A more detailed description of hardware logic and testing processes that can be executed by lighting units is provided with respect to FIGS. 2 and 3, below.

In some implementations, one or more of lighting units 108 can include wireless communication capabilities. For example, one or more of lighting units 108A, 108B, 108C may include a transceiver that is configured to communicate directly with a wireless base station, such as that of a cellular network, e.g., to provide data directly to a management system, as discussed below. In such aspects, lighting units 108 may not need an intermediary gateway for transacting data with one or more computer networks, such as the Internet.

In practice, each of lighting units 108 can be installed at a different location (e.g., a different room, different building, or different tenant location, etc.). By way of example, lighting unit 108A, may represent an emergency lighting system installed at a university hospital, whereas lighting units 108B, represents an emergency lighting system installed at a university lab. In such an arrangement, lighting units 108A and 108B, although installed at different locations, can be owned/operated by the same entity/tenant/stakeholder (e.g., the same university). As such, testing performed at one or more of lighting units 108 can be performed on a per-room, per-building, per-tenant or per-stakeholder basis.

Testing of lighting units 108 is further facilitated by management system 104. Data relating to power and/or lighting characteristics monitored locally at a given lighting unit (108A, 108B, 108C) can be transmitted to management system 104, e.g., for example via a backhaul and/or cellular network.

Management system 104 can support functions for scheduling and/or performing emergency lighting tests by initiating simulated power failure events at one or more of lighting units 108. In some implementations, management system 104 can be automatically configured to create or adjust testing schedules, for example, based on testing result histories for one or more devices. By way of example, if managed lighting units do not properly issue or report tests as expected, management system 104 can automatically perform retests.

Results from the tests can also be aggregated and stored by management system 104. In some approaches, the results of one or more emergency tests can be stored to a secured database that can be referenced using a unique identifier of one or more lighting units, an identifier of a group of lighting units, and/or an identifier of an owner or stakeholder associated with one or more lighting units, etc. To ensure that testing result data is not lost, management system 104 can be automated to perform periodic backups, e.g., on a daily, weekly, or monthly basis, etc.

Management system 104 can also support the export/import of test results and raw data, for example, so that test data can be backed-up or transferred between different IoT management system databases. In such embodiments, different data formats can be supported, for example, so that imported/exported data can be formatted to match the receiving system. Data format flexibility also enables management system 104 to manage data pertaining to different types of devices, and across different versions (e.g., software, firmware versions).

In some aspects, management system 104 can also be configured to monitor and display information regarding components that support or make up one or more lighting units 108. For example, management system 104 may be configured to monitor operations of one or more devices in a supporting network (e.g., backhaul network), such as backhaul gateway 110. In that regard, management system 104 can be configured to detect network and/or power failure of backhaul gateway 110, or of other network servers/devices that support management system 104. Additionally, management system 104 can be configured to measure power parameters relating to the battery and/or lighting units 108, such as current input/output levels and/or voltage parameters. Such parameters can be displayed on a dashboard provided by management system 104. For example, battery levels for one or more managed devices can be displayed. Measured power parameters can be used to perform predictions about the likelihood that a given device could pass an emergency test. To this end, management system 104 may use battery-specific mathematical models and/or machine-learning models to make performance predictions about one or more batteries under management. By way of example, management system 104 may be configured to predict the likelihood that one or more of the lighting units would be able to pass a 30 minute test, a 60 minute test, or a 90 minute test, etc.

Management system 104 can also be configured to make inferences about device longevity. For example, collected power characteristics can be used to predict what components have failed, or are likely to fail. As discussed above, device specific models and/or machine learning techniques may be used to perform prediction calculations. For example, based on various power characteristics received from one or more lighting units 108, management system 104 can be configured to estimate the remaining life of one or more lighting arrays, individual lighting elements and/or batteries (e.g., a number of remaining charge/discharge cycles).

Failure predictions can be used to trigger the generation/sending of automatic messages to a user or manager. For example, a predicted high likelihood of near-term component failure could be used to automatically order replacement lighting elements and/or batteries, etc. Additionally, when used to manage multiple IoT devices, management system 104 can be configured to batch messages pertaining to the scheduling of preventative maintenance work.

In some implementations, management system 104 can automatically generate and send notifications regarding a flagged event, such as in response to the detection of a failed lighting test, or based on a predicted likelihood that a lighting array, lighting element, and/or charge storage device is likely to fail in the future. For example, failed test results can trigger notifications to appropriate stakeholders and/or to a third-party (e.g., fire department, state regulator, etc.), based on the test results. Notifications can also be triggered based on severity; for example, notifications may be contingent upon the detected failure of a battery, lighting array, and/or backhaul network. Depending on implementation, other factors can also indicate severity, such as an amount of time elapsed since a detected failure, a failure type, detected failure patterns, and the like. In some approaches, stakeholder notifications can be conditioned upon stakeholder preferences and/or availability. For example, notification generation can be performed by taking into consideration stakeholder and/or maintenance staff schedules or availability.

General management system 104 functionality and notification capabilities are further enhanced through functionality provided by one or more Application Programming Interfaces (APIs) and/or a graphical user interface (GUI). APIs can facilitate the ability for lighting reports and management functions to be tied to other systems and applications, such as an application executed on a user device, such as a notebook, tablet computer and/or smartphone device. By way of example, APIs can provide the ability for testing of lighting units 108 to be controlled by remote systems/applications outside of management system 104. For example, remote applications may be configured to retrieve and ingest historic test performance data for one or more of lighting units 108 for use in a third-party dashboard or reporting and compliance report.

In some aspects, APIs can enable management system 104 to function with other third party systems. For example, based on failure predictions and/or test results, management system 104 can connect with building maintenance software to generate maintenance requests or "tickets."

In some approaches, a GUI provided by management system 104 enables users to directly access functionality of management system 104. By way of example, management system 104 users can include customers/tenants/stakeholders that wish to control and manage emergency lighting units installed at their own locations/properties. In the example of FIG. 1, a user associated with user device 112 can be provided with the ability to control/manage testing of lighting units 108, using a GUI provided on management system 104. By way of example, a user, via the GUI, can initiate wireless updates (e.g., firmware, software, and/or data updates) to one or more remotely managed IoT devices. As such, management system 104 can function as a centralized management platform for a variety of building maintenance and emergency devices, including but not limited to: fire safety devices, signage devices, emergency lighting devices, and/or emergency sensors, etc. Additional details regarding example GUIs that can be used to aid remote testing functionality are discussed in further detail with respect to FIGS. 4A and 4B, below.

Although management system 104 is illustrated as a single discrete computing unit, it is understood that management system 104 can be implemented using a variety of other approaches. For example, management system 104 can include a variety of distributed physical and/or virtual devices, including one or more Virtual Machines (VM's), and/or networking containers instantiated as part of the cloud computing environment.

Figure 2:
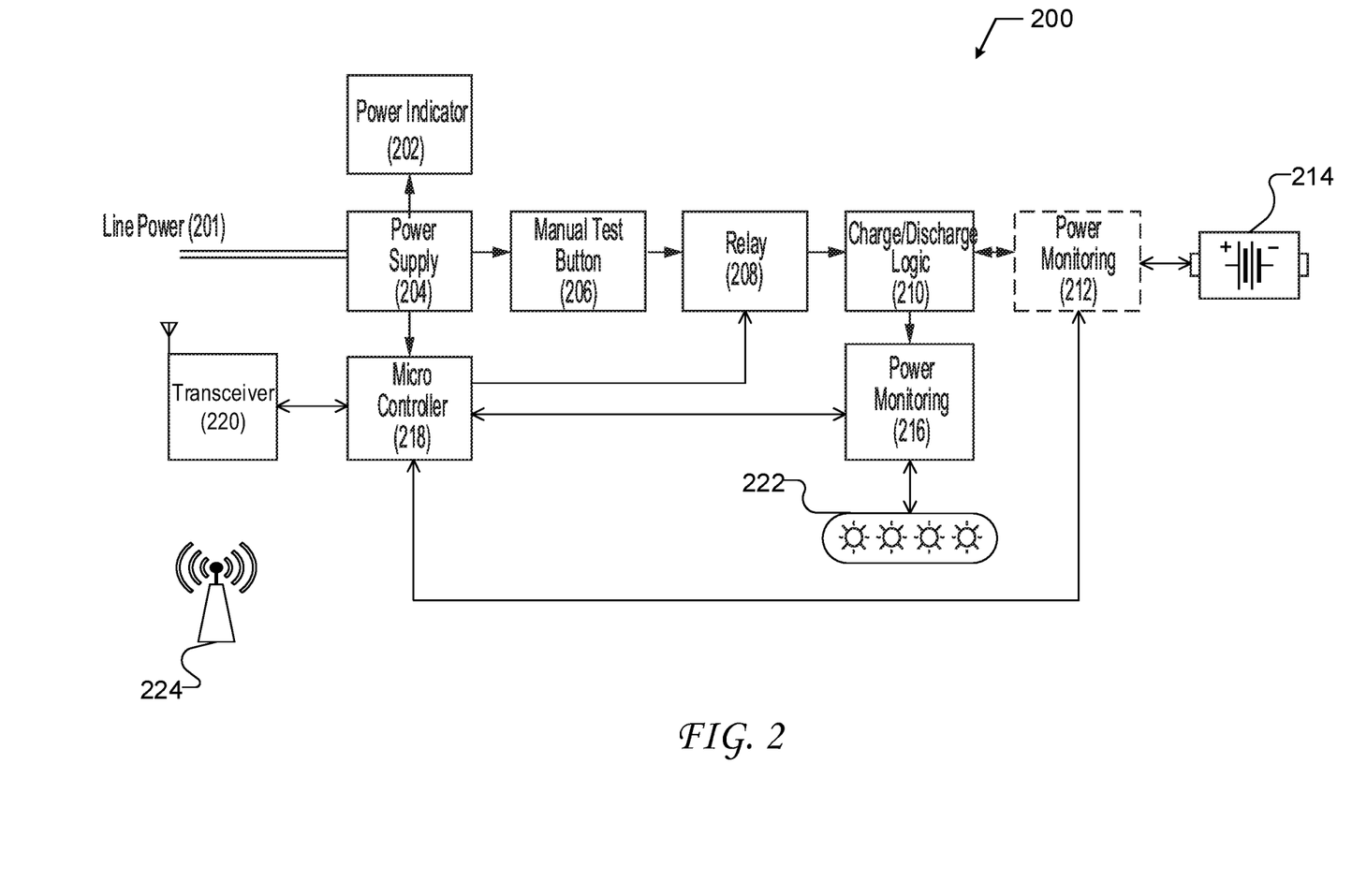
FIG. 2 illustrates a conceptual block diagram of various hardware modules that can be used to implement an emergency lighting apparatus, according to some aspects of the disclosed technology.

FIG. 2 illustrates a conceptual block diagram of various hardware modules that can be used to implement an emergency lighting system 200, according to some aspects of the disclosed technology. System 200 includes a first power supply 204 that is coupled to a microcontroller 218, and a power indicator 202. First power supply 204 can include one or more transformers and power converters (AC/DC converters) to convert received line power 201, into a power source suitable for lighting array 222. System 200 also includes a manual test button 206, an interrupt relay 208 (relay), charge/discharge module 210, and a first power monitoring module 212, all of which are series connected to a second power supply 214. Charge/discharge module 210 is further coupled to a second power monitoring module 216, which in turn is coupled with a lighting array 222. Additionally, microcontroller 218 is coupled between a transceiver 220, relay 208, and second power monitoring module 216.

As used herein, relay 208 can include various types of switching systems or circuitry. For example, relay 208 may be implemented using one or more mechanical or electro-mechanical switching devices, transistors, field-effect transistors (FETs), metal-oxide silicon field-effect transistors (MOSFETs), and/or opto-couplers, etc. Other types of switching devices can be used to implement relay 208, without departing from the scope of the disclosed technology.

Power indicator 202 can include a light/LED or other visual indicator that represents operability of first power supply 204. For example, light emitted by power indicator 202 can signal proper operation of first power supply, i.e., the receipt of line power 201. Manual test button 206 can provide the ability to manually interrupt power delivered from line power 201, via first power supply 204, to lighting array 222. By way of example, test button 206 can be actuated by a physically present user to manually interrupt line power 201 deliver to array 222. As such, test button 206 can be used by a physically present user/operator to verify functionality of system 200 in the event of interruption to line power 201 (e.g. a blackout).

When not in a real or simulated emergency scenario, system 200 is configured to provide power to lighting array 222 via second power supply to 214, and first power supply 204. That is, line power 201 received at first power supply 204 provides charge to second power supply 214. In turn, second power supply 214 provides power to lighting array 222. As such, second power supply 214 typically maintains a full (or relatively full) charge, due to connection to first power supply 204. However, when power supplied by line power 201 is interrupted, e.g., in the event of a blackout, charge stored by second power supply 214 can be used to automatically deliver power to lighting array 222, thereby providing emergency lighting in the event of a blackout.

To perform emergency test operations, microcontroller 218 is configured to perform various steps necessary to verify operability of secondary power supply 214, and/or lighting array 222, in the event of line power 201 interruptions. In some approaches, microcontroller 218 can perform testing on system 200 in response to one or more interrupt commands, for example, that are provided to microcontroller 218 based on a predetermined schedule. The schedule can indicate dates and times during which tests are to be performed. Testing schedules can also specify a duration that tests are to be performed, i.e., a length of time in which power provided from line power 201 is interrupted through actuation of relay 208. By way of example, a testing schedule can specify that a test is to be performed periodically, e.g. the first of every month, for a predetermined duration, e.g. for 30 seconds, 90 seconds, for 5 minutes, etc. In some aspects, testing schedules can be stored to a local memory of system 200 (not illustrated). When emergency testing is scheduled, the test can be initiated by the generation of an interrupt command that triggers one or more relays to interrupt line power that is delivered via a first power supply. After a predetermined duration, the relay can be reset, thereby resuming line power delivery to the system. In some aspects, relay reset is caused by a resume command that is generated after the predetermined time period.

In other aspects, emergency testing can be performed remotely, e.g., through the receipt of an interrupt command by microcontroller 218, e.g. via transceiver 220. In such implementations, interrupt commands can be received by transceiver 220 from a local gateway, such as a router, wireless repeater, or backhaul gateway 224. Depending on the chosen deployment, wirelessly transmitted data may be encrypted, for example, to comport with privacy regulations or other standards. Interrupt commands relayed to microcontroller 218 can cause the actuation of relay 208 to interrupt the delivery of line power 201 to lighting array 222 via second power supply 214. Similar to scheduled testing, remotely received resume commands can end emergency testing, for example, by causing relay reset to resume the delivery of line power to lighting system/array.

For remotely controlled and locally scheduled testing scenarios, microcontroller 218 can monitor and collect power characteristics at different points in system 200, e.g., to verify the operability of second power supply and/or the operation of lighting array 214. By way of example, power monitoring module 212 can be used to measure voltage and/or current parameters of second power supply 214, after relay 208 interrupts the delivery of power from power supply 204. Power characteristics can be used to determine power dissipation parameters of second power supply 214, when emergency operation is initiated. In instances where adequate power is delivered by second power supply 214 to lighting array 222, the monitored power characteristics may be used to make a determination that emergency lighting system 200 is adequately operable.

It is understood that power characteristics can be monitored at different points in the circuitry of emergency lighting system 200, without departing from the scope of the technology. For example, current discharge and/or voltage characteristics of first power supply 204 can be monitored by a power monitoring module, for example, to ensure that power supplied by line power 201 and output from first power supply 204 are adequate to support emergency lighting system 200. Additionally, current discharge and/or voltage characteristics of second power supply 214 can be monitored by power monitoring module 212. For example, current entering and/or leaving second power supply 214 can be measured. Current measurements can be made either alone or in conjunction with voltage measurements, for example, taken at the positive terminal of a battery array comprising power module 212. In some implementations, voltage measurements can be accomplished at various points in the circuit by utilizing a voltage divider, and measuring half-voltage values.

Alternatively, power monitoring module 216 may be used to measure and/or record voltage/current characteristics being delivered at lighting array 222. For example, power monitoring module 216 can be used to measure an amount of current flowing into lighting array 222 that can be used to infer the operability of one or more lighting elements within lighting array 222. In some implementations, this can be accomplished by measuring a voltage drop across a fixed-value resistor leading into a given lighting element, or the entire lighting array. That is, one or more power monitoring modules (e.g. power monitoring module 212, 216), can be used to deduce/estimate the operability of various components within emergency lighting system 200. In some implementations, such estimates can be used to drive notifications and/or recommendations regarding maintenance, such as when to replace bulbs, LEDs, and/or batteries, etc.

Figure 3:
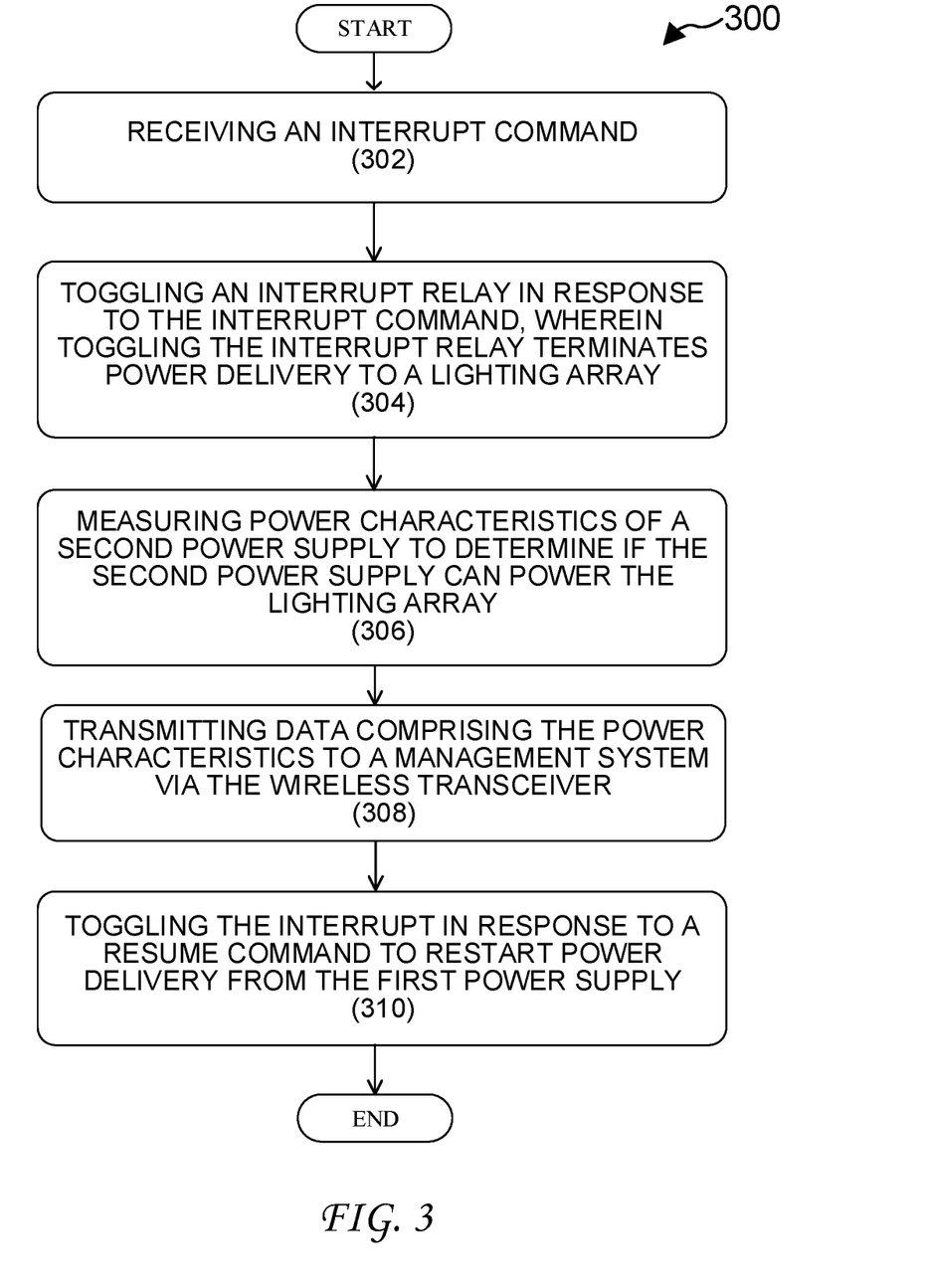
FIG. 3 illustrates steps of an example method for remotely testing an emergency lighting system, according to some aspects of the disclosed technology.

FIG. 3 illustrates steps of an example process 300 for remotely testing an emergency lighting system, according to some aspects of the disclosed technology. Process 300 begins with step 302 in which an interrupt command is received at an emergency lighting system, such as, lighting system 200. As discussed above, the interrupt command may be generated locally, for example, based on a locally stored testing schedule, or received from a remote device, such as management system 104, discussed above with respect to FIG. 1.

At step 304, an interrupt relay (e.g., relay 208) is toggled in response to the interrupt command, wherein toggling the interrupt relay terminates power delivery from a first power supply to a lighting array. As discussed above, the first power supply can be a power supply receiving power from the utility, such as first power supply 204 that receives line power 201, as discussed above with respect to FIG. 2. Toggling the interrupt relay can be used to simulate power failure event (blackout). Because power failures can last for various time durations, similarly power failures can also be performed for different time periods, for example, to verify the associated lighting array is operable for sufficient length of time without availability of utility power.

In step 306, one or more power characteristics of the emergency lighting system are measured. In some instances, measured power characteristics can be stored to a local memory of the emergency lighting system. Alternatively, data comprising the measured power characteristics can be transmitted to a remote management system, such as remote management system 104, discussed with respect to FIG. 1.

Measured power characteristics can include current and/or voltage measurements taken at one or more points within the emergency lighting system. Power characteristics can include current and/or voltage measurements of a secondary (backup) power supply that provides power to the lighting array when utility current is unavailable. Measured power characteristics can also include current and/or voltage parameters of a lighting array, and/or one or more lighting elements contained therein. By way of example, power characteristics can include the measurement of current in/out of one or more light bulbs, LEDs, or other components in the emergency lighting system.

In step 308, data comprising the power characteristics are transmitted to a management system via the wireless transceiver. Subsequently, in step 310 the interrupt is again toggled in response to a resume command to cause a restart of power delivery from the first power supply. In some aspects, testing of the emergency lighting system, including the initiation of new tests, and updating of schedules locally stored on the emergency lighting system can be facilitated by remote device.

Figure 4A:
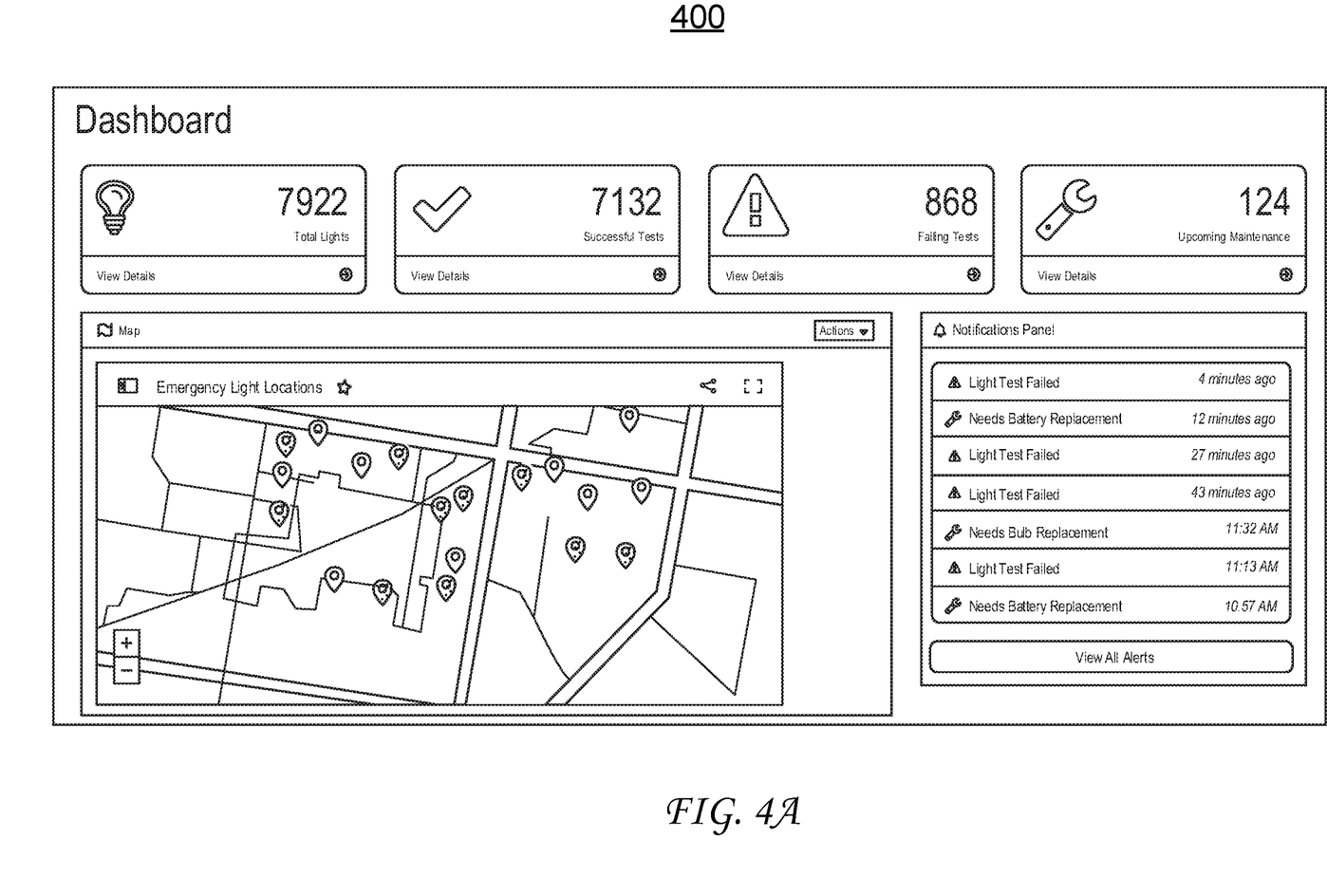
FIGS. 4A and 4B illustrate an example of Graphical User Interfaces (GUIs) that can be used to facilitate remote management of one or more emergency lighting systems.
Figure 4B:
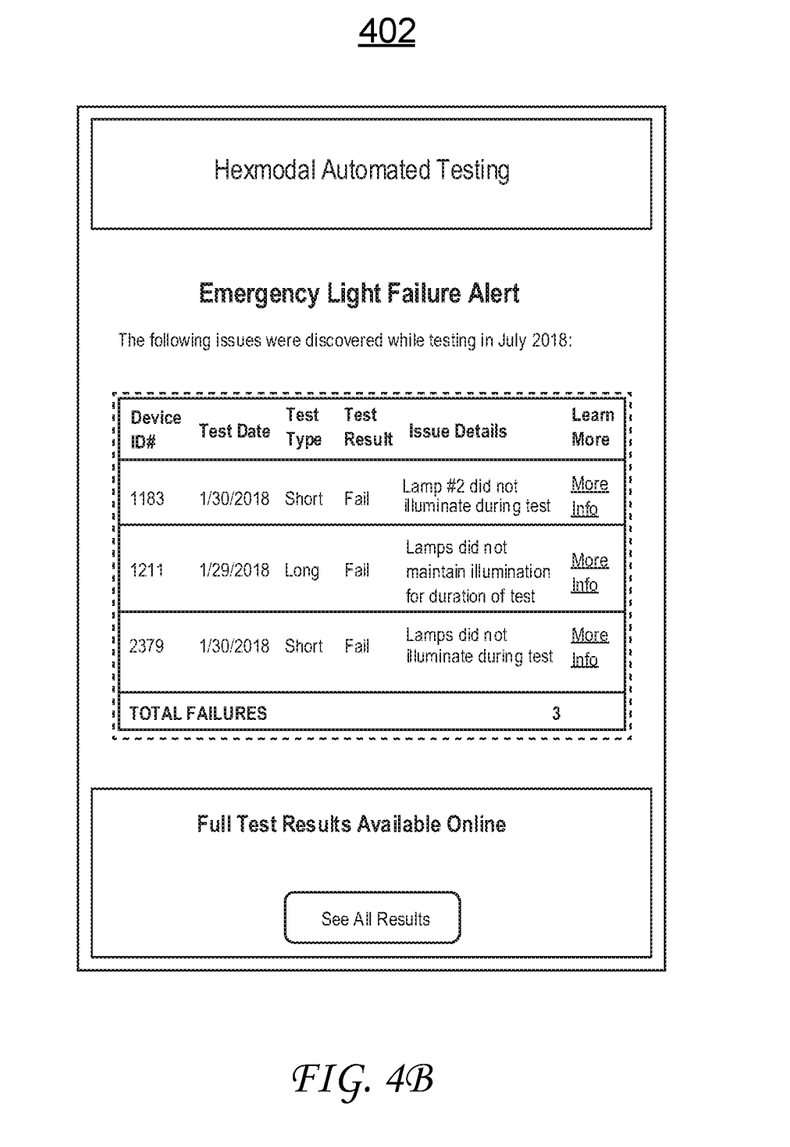

FIGS. 4A and 4B illustrate examples of Graphical User Interfaces (GUIs) that can be used to facilitate user management of one or more emergency lighting systems. Specifically, FIG. 4A illustrates a dashboard 400 that can be provided by a remote management system of the disclosed technology. Dashboard 400 provides an example of a user interface used to provide information regarding one or more emergency lighting systems under management of the remote management system. For example, dashboard 400 provides indications of a total number of emergency lighting units under management (7922), as well as historic data regarding the performance of previous tests and other test/failure issues that may be of relevance to the user. Additionally, in example dashboard 400, geographic information (a map) is provided to indicate physical locations of various remotely managed devices. Additionally, a notifications panel provides information regarding test failures, including recommendations regarding what emergency lighting systems need servicing, such as lighting elements (bulb) replacements, and/or battery replacements etc. It is understood that various other selections of information can be provided in a greater (or fewer) number of informational panels within dashboard 400, without departing from the scope of the disclosed technology.

FIG. 4B illustrates an example communication/notification 402 that can be generated subsequent to the performance of one or more emergency lighting system tests. In the example of notification 402, indications of emergency light testing failures are provided, including information referencing specific devices (i.e. a device ID), test date information, test type information (e.g. short/long), and a test result (e.g. password fail). Although notification 402 provides an example in which light testing results are provided via a graphical user interface, other notification types are contemplated. For example, testing results may be provided to a user/organization using a variety of other communication channels, including but not limited to email, and/or SMS (text message), etc.

Figure 5:
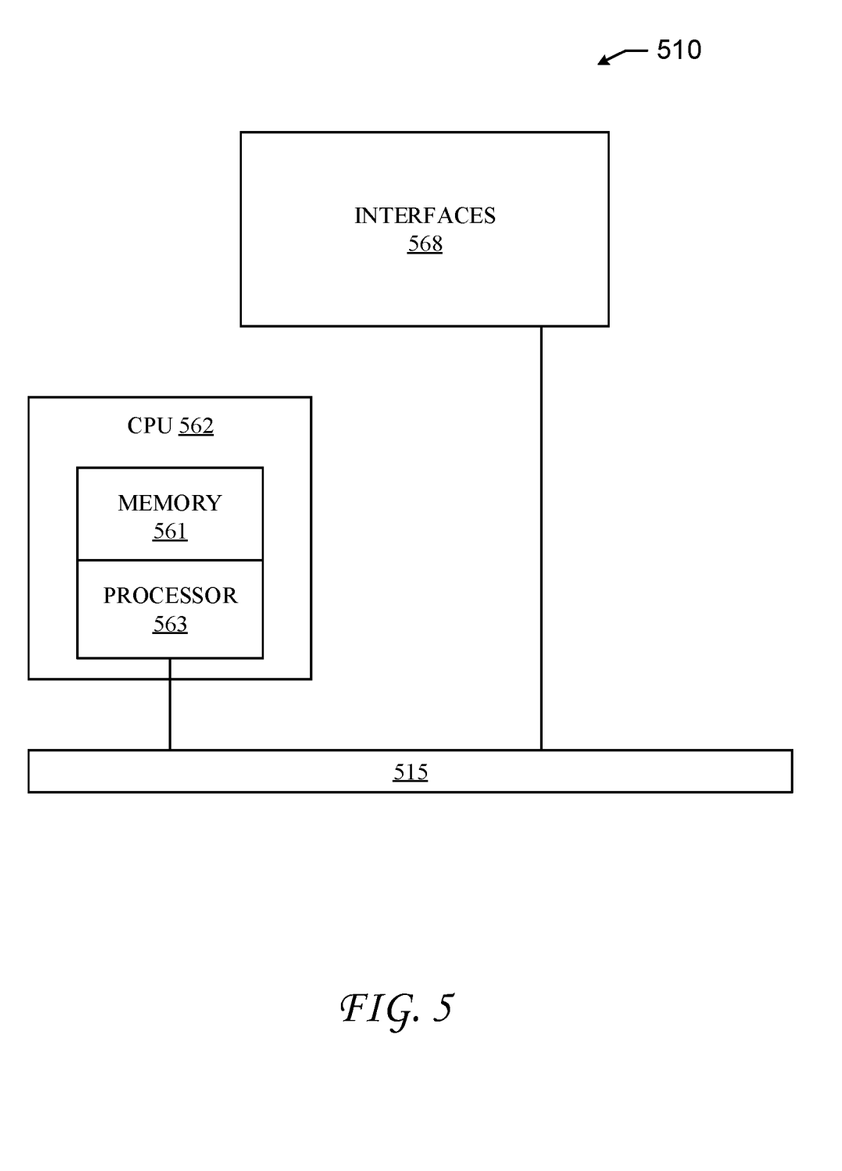
FIG. 5 illustrates an example of an electronic system with which some aspects of the subject technology can be implemented.

FIG. 5 illustrates an example system in which some aspects of the technology can be implemented. Specifically, FIG. 5 illustrates an example processor-based device 510 that can include, but is not limited to an emergency lighting system, (e.g., used to implement an emergency lighting device), and/or hardware/software configured to implement a management system the disclosed technology.

Processor-based device 510 includes a master central processing unit (CPU) 562, interfaces 568, and a bus 515 (e.g., a PCI bus). When acting under the control of appropriate software or firmware, CPU 562 is responsible for executing operations for receiving an interrupt command, via the wireless transceiver, from the wireless backhaul gateway, toggling the interrupt relay in response to the interrupt command, wherein toggling the interrupt relay terminates power delivery to the lighting array, measuring one or more power characteristics of the second power supply to determine if the second power supply can power the lighting array.

Additionally, CPU 562 can be configured to execute operations for: transmitting data comprising the one or more power characteristics to a management system via the wireless transceiver, receiving a resume command, via the wireless transceiver, from the wireless backhaul gateway, and toggling the interrupt relay in response to the resume command to cause power delivery from the first power supply to the lighting array to be restarted. CPU 562 can accomplish these functions under the control of software including an operating system and other applications software. CPU 562 can include one or more microcontrollers/microprocessors/processors 563, such as a processor from the Motorola family of microprocessors or the MIPS family of microprocessors.

In an alternative embodiment, processor 563 is specially designed hardware for controlling the operations of processor-based device 510. In a specific embodiment, a memory 561 (such as non-volatile RAM and/or ROM) also forms part of CPU 562. However, there are many different ways in which memory could be coupled to the system.

Interfaces 568 can be provided one or more transceivers and/or interface cards (sometimes referred to as "line cards"). Generally, they control the sending and receiving of data packets over the network and sometimes support other peripherals used with a router. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management. By providing separate processors for intensive communications tasks, these interfaces allow the master microprocessor 562 to efficiently perform routing computations, network diagnostics, security functions, etc.

Although the system shown in FIG. 5 is one example processor-based device of the present invention, it is by no means the only network device architecture on which the present invention can be implemented. For example, an architecture having a single processor that handles communications as well as routing computations, etc. is often used. Further, other types of interfaces and media could also be used with the router.

Regardless of the network device's configuration, it may employ one or more memories or memory modules (including memory 561) configured to store program instructions for the general-purpose network operations and mechanisms for roaming, route optimization and routing functions described herein. The program instructions may control the operation of an operating system and/or one or more applications, for example. The memory or memories may also be configured to store tables such as mobility binding, registration, and association tables, etc.

Although the exemplary embodiment described herein employs storage device 460, it should be appreciated by those skilled in the art that other types of computer readable media which can store data that are accessible by a computer, such as magnetic cassettes, flash memory cards, digital versatile disks, cartridges, random access memories (RAMs) 450, read only memory (ROM) 440, a cable or wireless signal containing a bit stream and the like, may also be used in the exemplary operating environment. Non-transitory computer-readable storage media expressly exclude media such as energy, carrier signals, electromagnetic waves, and transitory signals per se.

To enable user interaction with processor-based device 510, interfaces 568 can represent any number of input mechanisms, such as a microphone for speech, a touch-sensitive screen for gesture or graphical input, keyboard, mouse, motion input, speech and so forth. Interfaces 568 can also represent one or more output devices or mechanisms known to those of skill in the art. In some instances, multimodal systems enable a user to provide multiple types of input to communicate with processor-based device 510.

For clarity of explanation, various system embodiments are presented as including individual functional blocks including functional blocks labeled as a "processor" (e.g., processor 563) "CPU" (e.g., CPU 562) or "microprocessor/microcontroller" (e.g., microcontroller 218) or processor 563. The functions these blocks represent may be provided through the use of either shared or dedicated hardware, including, but not limited to, hardware capable of executing software and hardware, such as processor 563, that is purpose-built to operate as an equivalent to software executing on a general-purpose processor.

For example, the functions of one or more processors can be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) for storing software performing the operations discussed below, and random-access memory (RAM) for storing results. Very large-scale integration (VLSI) hardware embodiments, as well as custom VLSI circuitry in combination with a general-purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system 568 can practice all or part of the recited methods, can be a part of the recited systems, and/or can operate according to instructions in the recited non-transitory computer-readable storage media. Such logical operations can be implemented as modules configured to control the CPU 562 or processor 563 can be configured to perform particular functions according to the programming of the module.

It is understood that any specific order or hierarchy of steps in the processes disclosed is an illustration of exemplary approaches. Based upon design preferences, it is understood that the specific order or hierarchy of steps in the processes may be rearranged, or that only a portion of the illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more."

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A system for simulating power failure, comprising:
an interrupt relay coupled between a first power supply and a lighting array;
a power monitoring module coupled to a second power supply wherein the second power supply is configured to provide power to the lighting array if power supplied by the first power supply is interrupted;
a wireless transceiver configured for transacting data with a wireless backhaul gateway; and
a microcontroller coupled to the power monitoring module, the interrupt relay, and the wireless transceiver, wherein the microcontroller is configured to perform operations for:

receiving an interrupt command wherein the interrupt command is locally generated based on a predetermined testing schedule or wherein the interrupt command is received from a management system;

terminating power delivery from the first power supply to the lighting array in response to the interrupt command; and measuring one or more power characteristics of the second power supply.

2. The system of claim 1, wherein the microcontroller is further configured to perform operations comprising:

transmitting data comprising the one or more power characteristics to the management system via the wireless transceiver.

3. The system of claim 1, wherein measuring the one or more power characteristics of the second power supply further comprises:

measuring one or more voltage characteristics of the second power supply.

4. The system of claim 1, wherein measuring the one or more power characteristics of the second power supply further comprises:

measuring one or more current characteristics of the second power supply.

5. The system of claim 1, wherein the second power supply comprises one or more battery storage cells.

6. A method for remotely managing a lighting system, the method comprising:

receiving an interrupt command at the lighting system wherein the interrupt command is locally generated based on a predetermined testing schedule or wherein the interrupt command is received from a management system;

terminating power delivery from a first power supply to a lighting array of the lighting system in response to the interrupt command; and measuring one or more power characteristics of a second power supply that is configured to deliver power to the lighting array if power delivery from the first power supply is interrupted.

7. The method of claim 6, further comprising:
transmitting data comprising the one or more power characteristics to the management system.

8. The method of claim 6, further comprising:
measuring one or more voltage characteristics of the second power supply.

9. The method of claim 6, further comprising:
measuring one or more current characteristics of the second power supply.

10. The method of claim 6, wherein the second power supply comprises one or more battery storage cells.

11. A non-transitory computer-readable storage medium comprising instructions stored therein, which when executed by one or more processors, cause the processors to perform operations comprising:

receiving an interrupt command at a lighting system, wherein the interrupt command is locally generated based on a predetermined testing schedule or wherein the interrupt command is received from a management system;

terminating power delivery from a first power supply to a lighting array of the lighting system in response to the interrupt command; and measuring one or more power characteristics of a second power supply that is configured to deliver power to the lighting array if power delivery from the first power supply is interrupted.

12. The non-transitory computer-readable storage medium of claim 11, further comprising:
transmitting data comprising the one or more power characteristics to the management system.

13. The non-transitory computer-readable storage medium of claim 11, further comprising:
measuring one or more voltage characteristics of the second power supply.

14. The non-transitory computer-readable storage medium of claim 11, further comprising:
measuring one or more current characteristics of the second power supply.

* * * * *